(12) United States Patent
Kamei

(10) Patent No.: US 9,927,493 B2
(45) Date of Patent: Mar. 27, 2018

(54) BATTERY MONITOR SYSTEM

(71) Applicant: DENSO CORPORATION, Kariya, Aichi-pref. (JP)

(72) Inventor: Syunji Kamei, Nagoya (JP)

(73) Assignee: DENSO CORPORATION, Kariya (JP)

( * ) Notice: Subject to any disclaimer, the term of this patent is extended or adjusted under 35 U.S.C. 154(b) by 286 days.

(21) Appl. No.: 14/713,279

(22) Filed: May 15, 2015

(65) Prior Publication Data

US 2016/0003915 A1 Jan. 7, 2016

(30) Foreign Application Priority Data

Jul. 3, 2014 (JP) .................. 2014-137600

(51) Int. Cl.
*G01N 27/416* (2006.01)
*G01R 31/36* (2006.01)

(52) U.S. Cl.
CPC ....... *G01R 31/3658* (2013.01); *G01R 31/362* (2013.01)

(58) Field of Classification Search
CPC ................................................ G01R 31/3658
USPC ......................................................... 324/434
See application file for complete search history.

(56) References Cited

U.S. PATENT DOCUMENTS

| | | | |
|---|---|---|---|
| 7,911,178 B2 * | 3/2011 | Kawata | B60L 11/1868 320/116 |
| 2013/0257441 A1 | 10/2013 | Sekiguchi | |
| 2014/0312915 A1 * | 10/2014 | Mukaitani | G01R 31/3624 324/434 |
| 2017/0223110 A1 * | 8/2017 | Lawson | H04L 67/1097 |

FOREIGN PATENT DOCUMENTS

| | | |
|---|---|---|
| JP | 1997-293539 A | 11/1997 |
| JP | 11-299111 A | 10/1999 |
| JP | 2008-263758 A | 10/2008 |
| JP | 2008-309747 A | 12/2008 |

* cited by examiner

*Primary Examiner* — Edward Tso
*Assistant Examiner* — Ahmed Omar
(74) *Attorney, Agent, or Firm* — Posz Law Group, PLC

(57) ABSTRACT

A battery monitor system is provided for plural battery groups. The battery monitor system includes plural monitor modules for monitoring battery voltages of the battery groups and provided with a non-volatile memory for storing monitor data, which includes voltages of the monitor battery, and a monitor controller for communicating with the monitor modules and transmitting command signals to the monitor modules thereby to store the monitor data in the non-volatile memory. The monitor controller causes the non-volatile memory to store the monitor data therein, when communication with the monitor controller is disabled for a predetermined threshold period.

8 Claims, 9 Drawing Sheets

BATTERY MONITOR SYSTEM

CROSS REFERENCE TO RELATED APPLICATION

This application is based on Japanese patent application No. 2014-137600 filed on Jul. 3, 2014, the contents of which are incorporated herein by reference.

FIELD

The present disclosure relates to a battery monitor system, which monitors a voltage of a battery formed of a number of battery cells connected in series.

BACKGROUND

Hybrid vehicles and electric vehicles recently use batteries of large capacity and high output power for driving motors. Each battery is formed of a number of battery cells connected in series. Each battery cell is a lithium-ion secondary battery cell, a nickel-hydrogen storage cell or the like. A battery monitor system monitors a battery voltage of the battery cells so that the battery cells do not abnormally over-charge or over-discharge. One exemplary battery monitor system is disclosed in patent document, JP 2008-309747A.

This battery monitor system is provided with plural battery groups, plural monitor integrated circuits (ICs) as monitor modules and a monitor microcomputer as a monitor controller. Each battery group is formed of plural battery cells connected in series. Each monitor IC monitors a battery voltage of the battery group. The monitor microcomputer communicates with plural monitor ICs. According to this system, each monitor IC monitors the battery voltage of corresponding one of plural battery groups and the monitor IC transmits monitor data acquired by monitoring the battery to the monitor microcomputer. In a case that a failure arises in the battery group, the monitor microcomputer analyzes data such as cell voltages transmitted from the monitor IC and, when necessary, stores and hold the data in a non-volatile memory such as an EEPROM connected to the monitor microcomputer.

According to the above-described conventional battery monitor system, the monitor microcomputer is disabled to receive data from the monitor microcomputer, when abnormality such as disconnection arises in any of communication lines connecting the monitor ICs and the monitor microcomputers. Under such a communication abnormality state, the monitor microcomputer cannot store, to the non-volatile memory to be held therein, the data such as cell voltages (data detected by the monitor ICs) detected at the time of failure in the battery group.

SUMMARY

It is therefore an object to provide a battery monitor system, which is capable of storing monitor data such as a battery voltage acquired by a monitor module even when any abnormality arises in communication between a monitor controller and the monitor module.

A battery monitor system is provided for plural battery groups, each of which is formed of plural battery cells. The battery monitor system includes plural monitor modules, a monitor controller. Each monitor module monitors a battery voltage of the corresponding battery group. The monitor module is provided with a non-volatile memory for storing monitor data, which includes as hold data a voltage of a monitored battery and information of occurrence of abnormal processing. The monitor controller communicates with the plural monitor modules. The monitor controller transmits command signals to the monitor modules thereby to store the monitor data in the non-volatile memory.

According to one aspect of the battery monitor system, the monitor module includes a memory control circuit, which causes the non-volatile memory to store the monitor data in the non-volatile memory, when communication with the monitor controller is disabled for a predetermined threshold period.

According to another aspect of the battery monitor system, the battery monitor module includes a power supply switching circuit and a memory control circuit. The power supply switching circuit switches over a power supply system so that power is supplied from the battery group to the monitor module when a module power supply voltage supplied from a power supply circuit to the monitor module falls to be lower than a predetermined threshold voltage. The memory control circuit causes the non-volatile memory to store the monitor data when the module power supply voltage of the power supply circuit falls to be lower than the predetermined threshold voltage.

DETAILED DESCRIPTION OF EMBODIMENT

A battery monitor system will be described below with reference to plural embodiments.

First Embodiment

Figure 1:
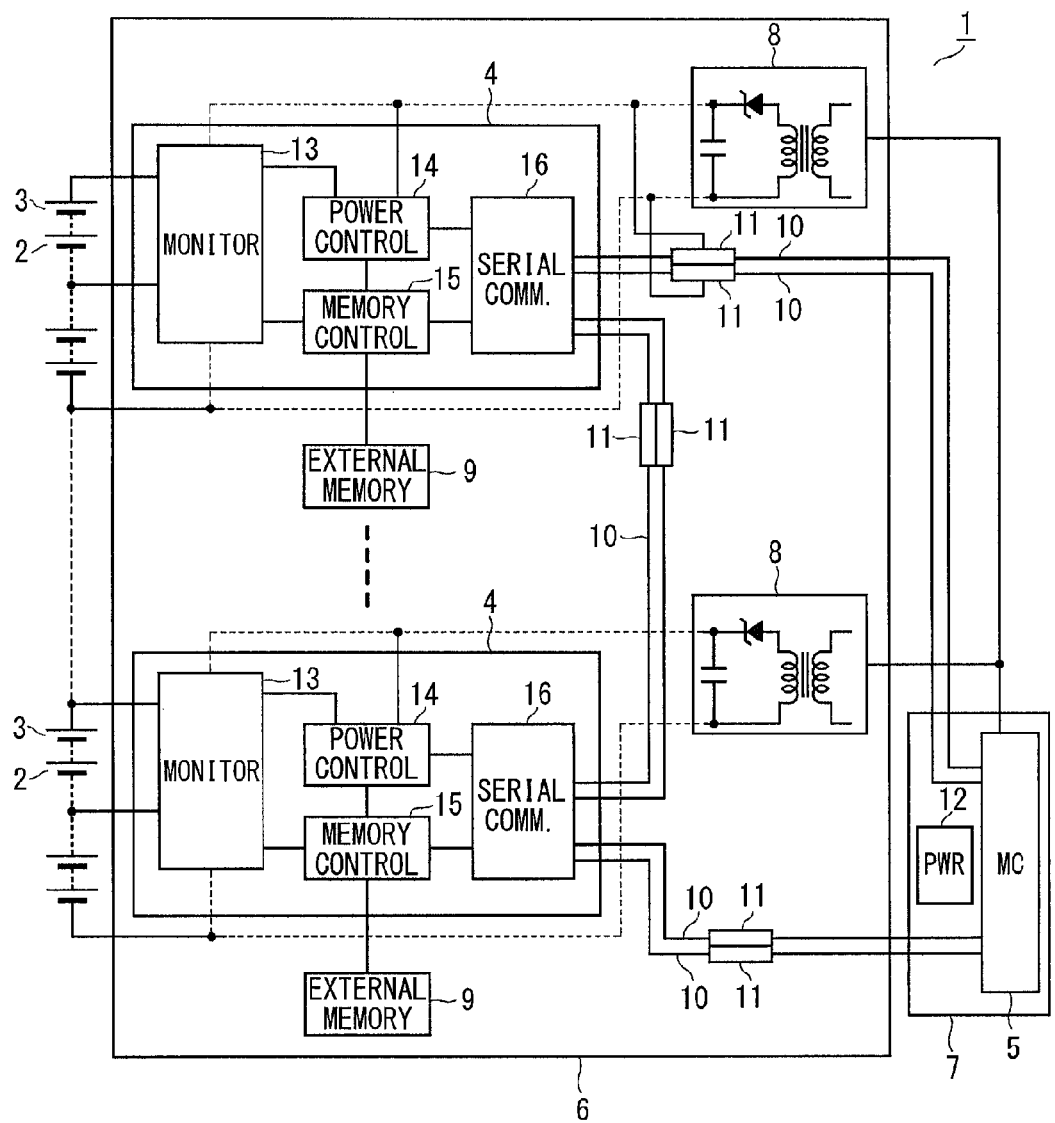
FIG. 1 is a block diagram showing schematically a general configuration of a first embodiment of a battery monitor system.

A first embodiment will be described below with reference to FIG. 1 to FIG. 4. Referring first to FIG. 1, a battery monitor system 1 includes plural battery groups 3, each of which is formed of plural battery cells 2 connected in series, plural battery monitor integrated circuits (ICs) 4 as monitor modules, which monitor battery voltages of plural battery groups 3, respectively, and a microcomputer 5 as a monitor controller, which communicates with plural battery monitor ICs 4.

The battery monitor ICs 4 are mounted on a battery monitor circuit board 6 and the microcomputer 5 is mounted on a monitor control circuit board 7, which is provided separately from the battery monitor circuit board 6. On the battery monitor circuit board 6, plural IC power supply devices 8, plural external memories 9, communication lines 10 and signal transmission elements 11 are mounted. The IC power supply devices 8 supply electric power to plural battery monitor ICs 4, respectively. The battery monitor ICs 4 write data in plural external memories 21, respectively. Some communication lines 10 connect plural battery monitor ICs 4 and the microcomputer 5. Other communication lines 10 connect the battery monitor ICs 4 each other. The signal transmission elements 11 are provided in the communications lines 10, respectively. The IC power supply device 8 is formed of, for example, an insulated-type power supply circuit, which is configured to start and shut off power supply under control by the microcomputer 5. The external memory 9 is a non-volatile memory formed of, for example, an EEPROM. The signal transmission element 11 is formed of, for example, a photo-coupler, and supplied with power from the IC power supply device 8.

On the monitor control circuit board 7, a microcomputer-power supply device 12 is mounted to supply electric power to the microcomputer 5. The microcomputer-power supply device 12 is formed of, for example, an insulated-type power supply circuit.

The battery monitor IC 4 includes a monitor circuit 13, a power supply control circuit (power supply switchover circuit) 14, an external memory control circuit 15 and a serial communication circuit 16. The monitor circuit 13 detects a voltage of the battery group 3 and writes detected data into the external memory 9 through the external memory control circuit 15. The power supply control circuit 14 outputs a power fall signal (and power supply shut-off signal) to the external memory circuit 15 upon detection that the power supply voltage of the IC power supply device 8 fall to be lower than a predetermined voltage (first threshold voltage) V1. The power supply control circuit 14 further outputs a power start signal to the external memory circuit 15 and the serial communication circuit 16 upon detection that the power supply voltage of the IC power supply device 8 rises to be higher than a predetermined voltage (second threshold voltage) V2. The power supply control circuit 14 switches over power supply states so that the power is supplied from the IC power supply device 8 to the battery monitor IC 4 when the IC power supply device 8 is started to operate and so that the power is supplied from the battery group 3 to the battery monitor IC 4 when the power supply voltage of the IC power supply device 8 falls (power supply was shut off).

The serial communication circuit 16 outputs a communication data reception signal to the external memory control circuit 15 upon receiving communication data from the microcomputer 5. The serial communication circuit 16 outputs a communication abnormality signal to the external memory control circuit 15 upon receiving no communication data from the microcomputer 5 even after an elapse of a predetermined period (first threshold period) T1 from reception of a power supply start signal of the IC power supply device 8.

Figure 3:
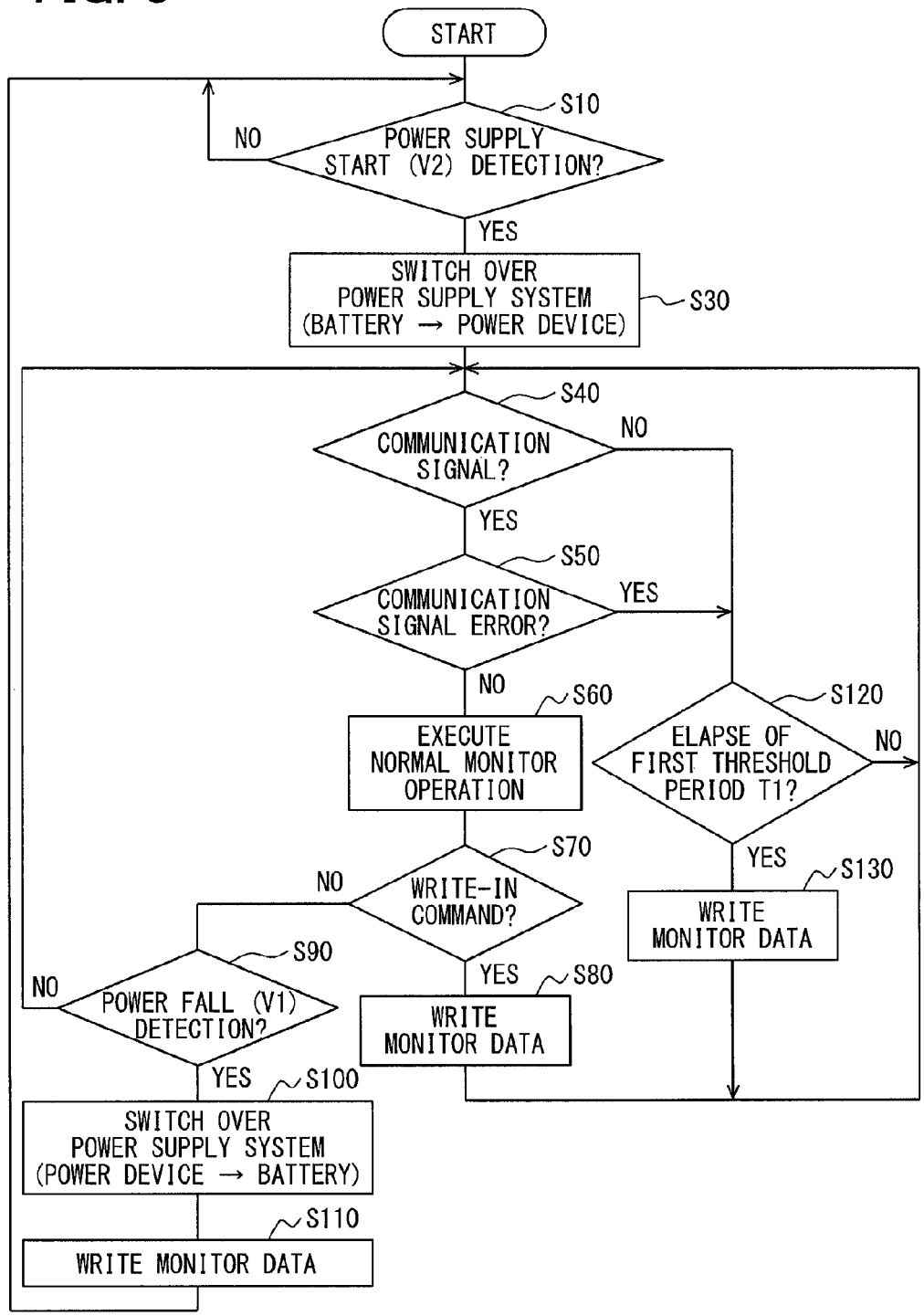
FIG. 3 is a flowchart showing processing executed by the first embodiment at power supply start time.
Figure 4:
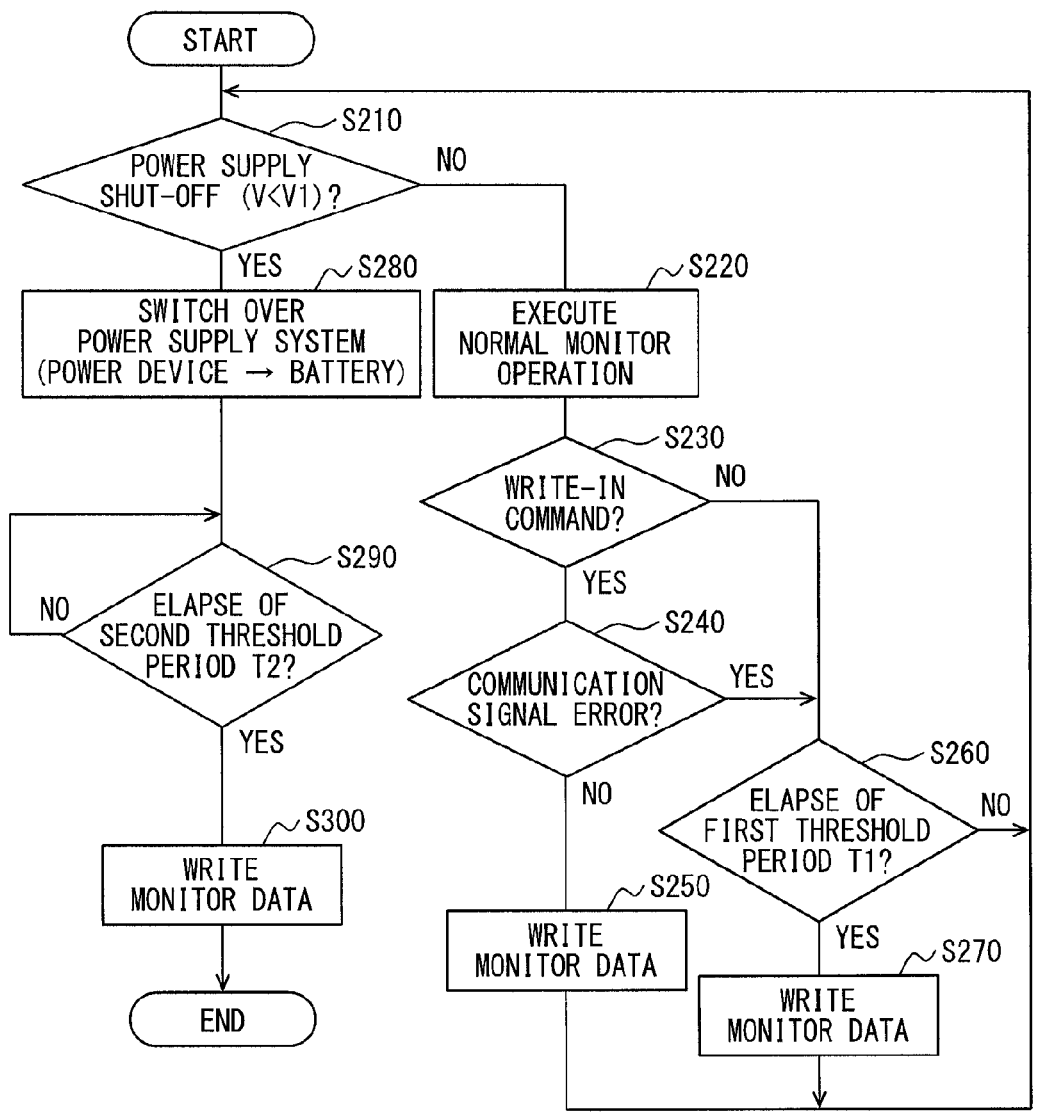
FIG. 4 is a flowchart showing processing executed by the first embodiment at power supply shut-off time.

An exemplary operation of the above-described battery monitor system will be described next with reference to FIG. 2A, FIG. 2B, FIG. 2C, FIG. 3 and FIG. 4. FIG. 3 and FIG. 4 show control processing executed by the battery monitor IC 4. The control processing executed at the time of starting the IC power supply device 8 will be described first with reference to FIG. 3.

At step S10 in FIG. 3, the battery monitor IC 4 checks whether a power supply start of the IC power supply device 8 is detected. In this case, the power supply control circuit 14 of the battery monitor IC 4 determines that the power supply is started upon detection that the power supply voltage from the IC power supply device 8 rises to be higher than the second threshold voltage V2. When it is determined at step S10 that the power supply of the IC power supply device 8 is not started (NO), the battery monitor IC 4 repeats checking of step S10.

Figure 2A:
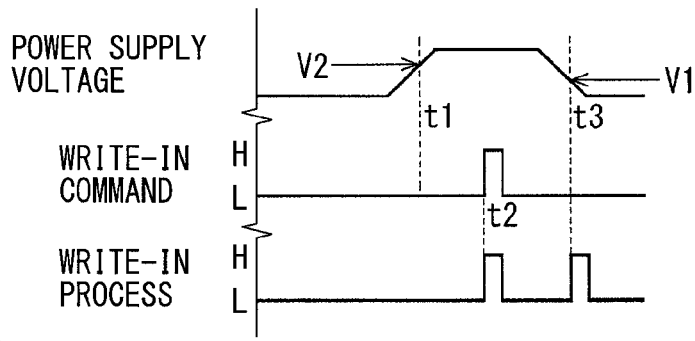
FIG. 2A to FIG. 2D are time charts showing operations of the first embodiment.

When the microcomputer 5 executes the processing of starting power supply of the IC power supply device 8, the power supply voltage of the IC power supply device 8 rises to be higher than the second threshold voltage V2 at time t1 as shown in FIG. 2A. The battery monitor IC 4 determines YES at step S10 and executes step S30. At step S30, the battery monitor IC 4 stops the power supply from the battery group 3 and switches over a power supply system to receive the power supply from the IC power supply device 8, Step S30 is thus power supply system switchover processing.

Then at step S40, the battery monitor IC 4 checks whether a communication signal is transmitted from the microcomputer 5. When the communication signal is transmitted, the battery monitor IC 4 determines YES and checks at step S50 whether there is a communication error, which arises for example when the communication signal includes error.

When there is no communication signal error, the battery monitor IC 4 determines NO at step S50 and executes step S60 to execute a normal monitor operation for monitoring a voltage and the like of the battery group 3. In this case, the battery monitor IC 4 acquires monitor data such as monitored battery cell voltages and abnormal processing information, which are to be stored and held as hold subject data, and temporarily stores the data in a RAM or the like provided in the battery monitor IC 4.

Then at step S70, the battery monitor IC 4 checks whether it received a write-in command signal from the microcomputer 5 for writing the monitor data into the external memory 9. Then the write-in command signal (for example, a high level signal) is received at time t2 as shown in FIG. 2A, the battery monitor IC 4 determines YES and executes step S80. The battery monitor IC 4 executes processing of writing the monitor data into the external memory 9 by the memory control circuit 15 (for example, a write-in processing signal for the external memory 9 is set to a high level at time t2 as shown in FIG. 2A). Then the battery monitor IC 4 repeats the above-described processing from step S40. In the first embodiment, the write-in command signal and the write-in processing signal are controlled to be set to high-active. However, the signals may be set to low-active, for example. That is, this signal level may be set arbitrarily.

When the write-in command signal is not received, the battery monitor IC 4 determines NO at step S70 and executes step S90. At step S90, the battery monitor IC 4 checks whether the power supply voltage of the IC power supply device 8 falls to be lower than the first threshold voltage V1. When the power supply voltage is not lower than the first threshold voltage V1, the battery monitor IC 4 determines NO and repeats the above-described processing from step S40 again.

When the power supply voltage becomes lower than the first threshold voltage V1 at time t3 as shown in FIG. 2A, the battery monitor IC 4 determines YES and executes step S100. At step S100, the battery monitor IC 4 stops the power supply from the IC power supply device 8 and switches over the power supply system to receive the power supply from the battery group 3. Step S100 thus executes power supply system switchover processing. Then at step S110, the battery monitor IC 4 executes the write-in processing of writing the monitor data into the external memory 9 by the memory control circuit 15. That is, the write-in processing signal for the external memory 9 is set to a high level at time t3 as shown in FIG. 2A. The battery monitor IC 4 repeats the above-described processing from step S10 again.

When the communication signal is not received, the battery monitor IC 4 determines NO at step S40 and executes step S120. At step S120, the battery monitor IC 4 checks whether a predetermined period (first threshold period) T1 elapses from no reception of the communication signal, that is, whether the communication signal is not received for the first threshold period T1. When the first threshold period T1 does not elapse, the battery monitor IC 4 determines NO and executes step S40 again.

Figure 2B:
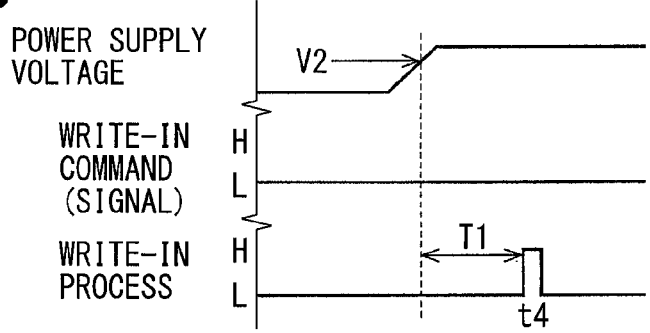

When the first threshold period elapses at time t4 as shown in FIG. 2B, the battery monitor IC 4 determines YES at step S120 and executes step S130. The battery monitor IC 4 executes the write-in processing of writing the monitor data into the external memory 9 by the memory control circuit 15 (the write-in processing signal for the external memory 9 is set to the high level at time t4 shown in FIG. 2B). The battery monitor IC 4 repeats the above-described processing from step S40. In this case, when no reception of the communication signal continues, step S130 is repeated at every elapse of the first threshold period to write the monitor data into the external memory 9. When the communication signal is received, the battery monitor IC 4 resets a timer, which measures elapse of time for the first threshold period T1.

Figure 2C:
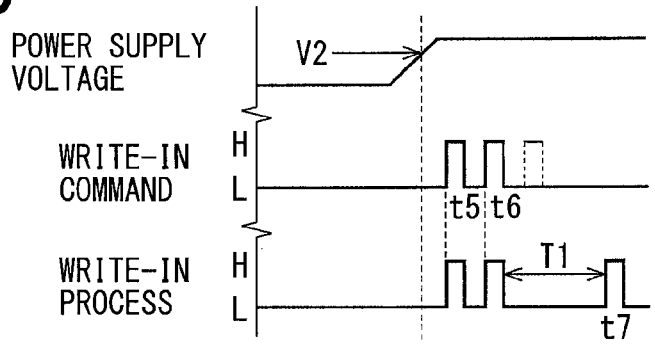

FIG. 2C shows an operation of the battery monitor IC 4. Specifically, the write-in command signal is transmitted two times (at times t5 and t6) from the microcomputer 5, the monitor data is written into the external memory 9 (the write-in processing signal for the external memory 9 is set to the high level at times t5 and t6 as shown in FIG. 2C), thereafter the write-in command signal is not transmitted continuously for the first threshold period T1, and the monitor data is written into the external memory 9 at time t7 (the write-in processing signal for the external memory 9 is set to the high level at time t7 as shown in FIG. 2C).

When the communication signal includes an error therein, the battery monitor IC 4 determines NO at step S50. The battery monitor IC 4 then checks at step S120 whether the first threshold period T1 elapses after detection of error in the communication signal. After step S120, the battery monitor IC 4 executes the same processing as that executed in the case of no reception of the communication signal (S40: NO).

A control operation executed when the power supply of the IC power supply device 8 is shut off will be described next with reference to FIG. 4. At step S210 in FIG. 4, the battery monitor IC 4 checks whether the power supply of the IC power supply device 8 is shut off. In this case, the power supply control circuit 14 of the battery monitor IC 4 checks whether the power supply voltage of the IC power supply device 8 falls to be lower than the first threshold voltage V1. When the power supply voltage is not lower than the first threshold voltage V1, the battery monitor IC 4 determines NO and executes step S220.

At step S220, the battery monitor IC 4 executes the normal monitor operation for monitoring the battery voltage and the like of the battery group 3. In this case, the battery monitor IC 4 acquires the monitor data, which is the subject data to be held such as the monitored battery cell voltage, the abnormal processing execution information, and stores such data temporarily in the RAM or the like of the battery monitor IC 4.

Then at step S230, the battery monitor IC 4 checks whether the write-in command signal for writing the monitor data into the external memory 9 is received from the microcomputer 5. When the write-in command signal is received, the battery monitor IC 4 determines YES and checks at step S240 whether there is the communication signal error. When the communication signal includes no error, the battery monitor IC 4 determines NO and executes at step S250 the processing of writing the monitor data into the external memory 9 by the memory control circuit 15 of the battery monitor IC 4. Then the battery monitor IC 4 repeats the above-described processing by executing step S210 again.

When the write-in command signal is not received, the battery monitor IC 4 determines NO at step S230 and checks at step S260 whether the first threshold period T1 elapses from the time point of no reception of the write-in command signal. When the first threshold period T1 does not elapse, the battery monitor IC 4 determines NO and executes step S210 again. When the first threshold period T1 elapses, the battery monitor IC 4 determines YES at step S260 and executes the processing of writing the monitor data into the external memory 9 by the memory control circuit 15 of the battery monitor IC 4 at step S270. Then the battery monitor IC 4 executes step S210 again. When the write-in command signal is not received continuously, step S270 is executed at every elapse of the first threshold period T1 so that the monitor data is written into the external memory 9. When the write-in command signal is received at step S230, the timer for measuring time of the first threshold period T1 is reset.

When the communication signal has any error, the battery monitor IC 4 determines YES at step S240 and checks at step S260 whether the first threshold period T1 elapses from the detection of error in the communication signal. Thereafter, the battery monitor IC 4 executes the same processing as that executed when the write-in command signal is not received.

Figure 2D:
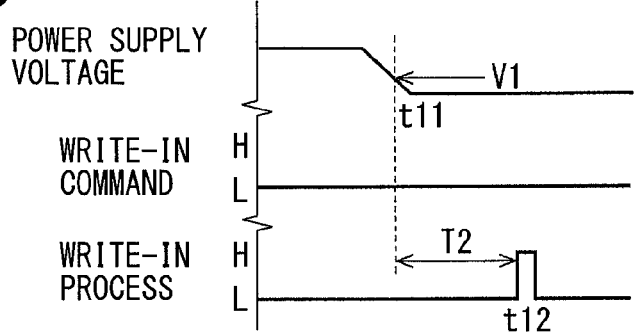

When the power supply voltage of the IC power supply device 8 falls to be lower than the first threshold voltage V1 at time t11 as shown in FIG. 2D, the battery monitor IC 4 determines YES at step S210 and executes step S280. At step S280, the battery monitor IC 4 stops power supply from the IC power supply device 8 and switches over the power supply system to receive power from the battery group 3. Then at step S290, the battery monitor IC 4 checks whether a predetermined period (second threshold period) T2 elapses from time t11, at which the power supply of the IC power supply device 8 is shut off. When the second threshold period T2 does not elapse yet, the battery monitor IC 4 determines NO and executes step S290 again.

When the second threshold period T2 elapses after the shut-off of power supply at time t12 as shown in FIG. 2D, the battery monitor IC 4 determines YES at step S290 and executes step S330. At step S300, the battery monitor IC 4 executes the processing of writing the monitor data into the external memory 9 by the memory control circuit 15 (the write-in processing signal is set to the high level at time t12 in FIG. 2D).

The battery monitor IC 4 terminates the control and waits for the next start of power supply of the IC power supply device 8 (that is, return to step S10 in FIG. 3). When the power supply of the IC power supply device 8 continues to be shut off, the battery monitor IC 4 executes the processing of step S300 at every elapse of the second threshold period T2 and writes the monitor data into the external memory 9.

As described above, according to the first embodiment described above, the battery monitor system is provided with at least one battery monitor IC 4 having the external memory 9 for storing monitor data, the microcomputer 5 having a function of communication with plural battery monitor ICs 4 and transmitting to plural battery monitor ICs 4 a command signal thereby to store the monitor data in the external memory 9. The battery monitor IC 4 includes a memory control circuit 15, which causes the external memory 9 to store the monitor data in the external memory 9, when communication with the microcomputer 5 is disabled because of no communication signal or communication signal error for the first threshold period T1. According to this configuration, even when an abnormality arises between the microcomputer 5 and the battery monitor IC 4, the monitor data such as the battery voltage acquired by the battery monitor IC 4 can be stored and held in the external memory 9. It is thus possible to analyze causes of abnormality based on the monitor data stored in the external memory 9.

Further, according to the first embodiment described above, the memory control circuit 15 is configured to cause the external memory 9 to store the monitor data when the communication with the microcomputer 5 is disabled for the first threshold period T1, and the memory control circuit 15 is configured to cause the external memory 9 to store the monitor data repeatedly when the same disabled condition continues even after the first threshold period T1. According to this configuration, when the communication with the microcomputer 5 is not possible or is continuously not possible, the monitor data can be stored in the external memory 9 surely and stored repeatedly, that is, plural monitor data of different time can be stored chronologically.

According to the first embodiment described above, the battery monitor system is provided with the power supply control circuit 14, which switches over power supply system so that power is supplied from the battery group 3 to the battery monitor IC 4 when the power supply voltage supplied to the battery monitor IC 4 and the external memory control circuit 15 is configured to cause the external memory 9 to store the monitor data when the power supply voltage of the IC power supply device 8 falls. According to this configuration, it is possible to surely store the monitor data in the external memory 9 even when the power supply voltage of the IC power supply device 8 falls.

According to the first embodiment described above, the external memory control circuit 15 is configured to cause the external memory 9 to store the monitor data when the power supply voltage of the IC power supply device 8 falls, and the external memory control circuit 15 is configured to cause the external memory 9 to store the monitor data repeatedly when the power supply voltage remains to be low. According to this configuration, it is possible to store plural pieces of monitor data chronologically, which are detected at different time when the power supply voltage of the IC power supply device 8 continues to be low.

Second Embodiment

Figure 5:
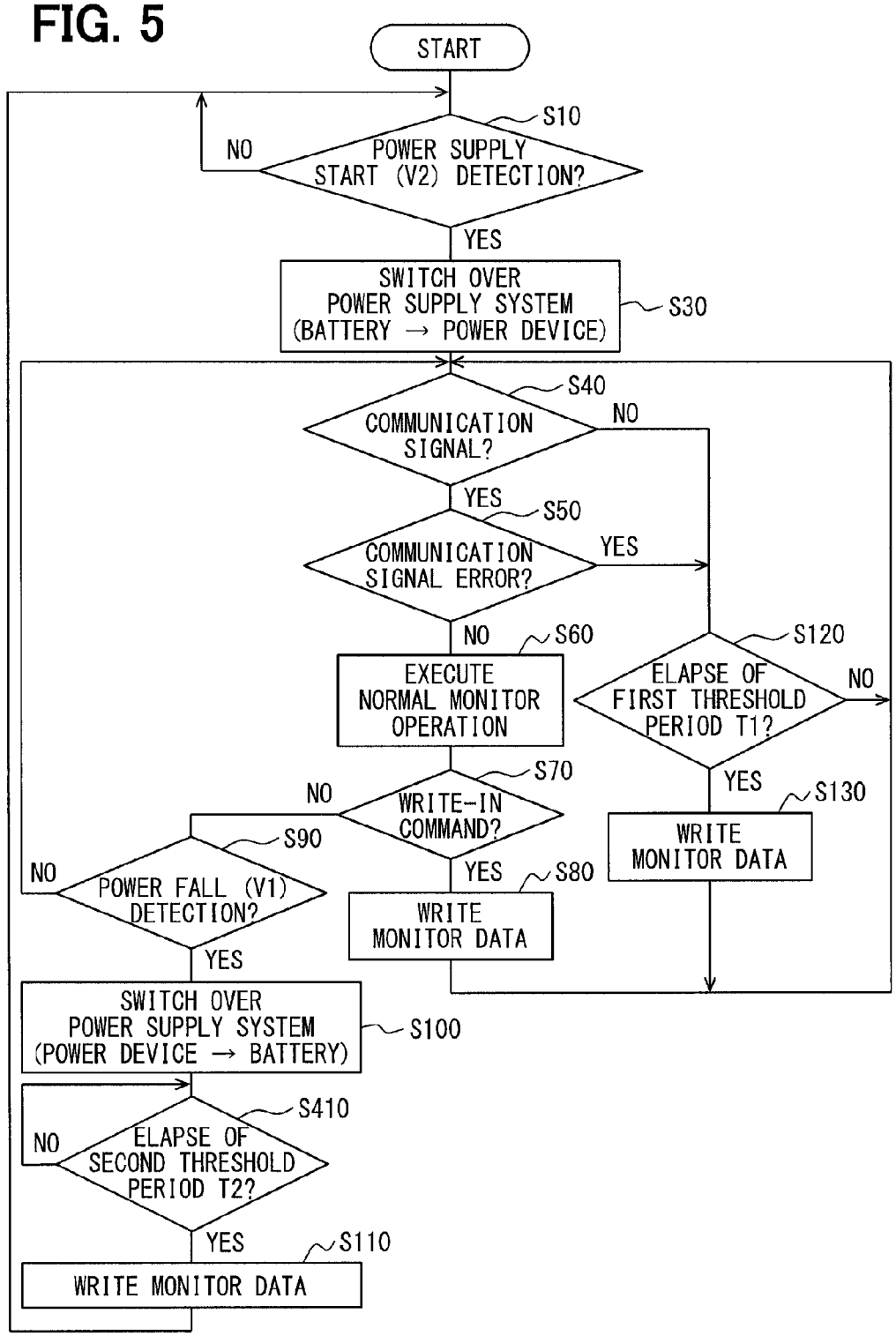
FIG. 5 is a flowchart showing, in correspondence to FIG. 3, processing executed by a second embodiment of a battery monitor system.

Referring to FIG. 5 showing a second embodiment, same structures as in the first embodiment are designated with the same reference numerals for simplicity. According to the second embodiment, check processing of step S410 is added between steps S100 and S110 in the flowchart of FIG. 3 of the first embodiment.

Specifically, after executing processing of switching over power supply system at step S100 of FIG. 5, the battery monitor IC 4 executes step S410 to check whether the second threshold period T2 elapses from the time point of fall of the power supply voltage of the IC power supply device 8. When the second threshold period T2 does not elapse, the battery monitor IC 4 determines NO and executes step S410 again. When the second threshold period T2 elapses, the battery monitor IC 4 determines YES at step S410 and executes the processing of writing the monitor data from the memory control circuit 15 of the battery monitor IC 4 into the external memory 9 at step S110.

The second embodiment is configured similarly to the first embodiment except for the above-described step S410. As a result, the second embodiment also provides the similar operation and advantage as the first embodiment.

Third Embodiment

Figure 6:
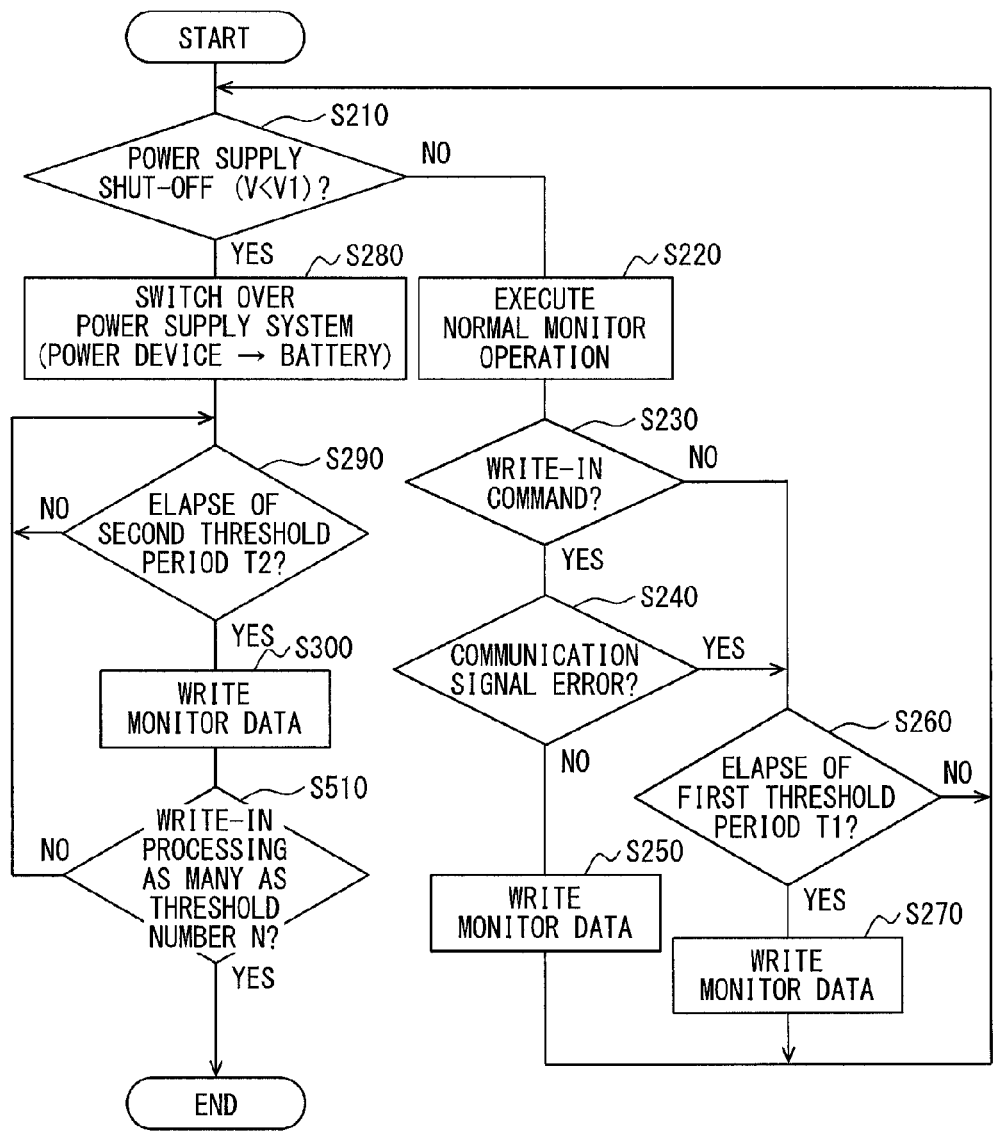
FIG. 6 is a flowchart showing, in correspondence to FIG. 4, processing executed by a third embodiment of a battery monitor system.

Referring to FIG. 6 showing a third embodiment, same structures as in the first embodiment are designated with the same reference numerals for simplicity. According to the third embodiment, check processing of step S510 is added next to the step S300 in the flowchart of FIG. 4 of the first embodiment.

Specifically, after executing the processing of writing the monitor data into the external memory at step S300, the battery monitor IC 4 checks whether the number of times of writing the monitor data into the external memory 9 (number of write-in processing) reaches a threshold number N. The threshold number N may be set to an arbitrary number such as three (present time, last time, second last time). As the number of writings of the monitor data into the external memory 9, the number of times of execution of the writing processing of step S250, step S270 and step S300 of FIG. 6 (FIG. 4) as well as step S80, step S110 and step S130 of FIG. 3 is counted (integrated).

When the number of times of writing the monitor data into the external memory 9 does not reach the threshold number N, the battery monitor IC 4 determines NO at step S510 and repeats the above-described processing from step S290. When the number of times of writing the monitor data into the external memory 9 reaches the threshold number N, the battery monitor IC 4 determines YES at step S510. The battery monitor IC 4 thus terminates the control and wait for the start of power supply of the IC power supply device 8 (execution of step S10 in FIG. 3). When the power supply of the IC power supply device 8 is continuously shut off, the processing of step S300 is executed to write the monitor data into the external memory 9 each time the second threshold time T2 elapses. When the number of times of writing of the monitor data into the external memory 9 reaches the threshold number N, no writing into the external memory 9 is executed.

The third embodiment is configured similarly to the first embodiment except for the above-described step S510. As a result, the third embodiment also provides the similar operation and advantage as the first embodiment.

Fourth Embodiment

Figure 7:
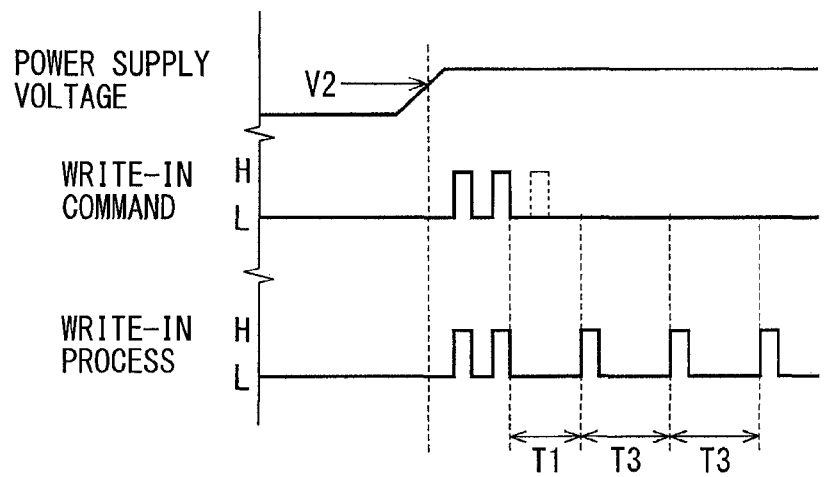
FIG. 7 is a time chart showing, in correspondence to FIG. 2C, an operation of a fourth embodiment of a battery monitor system.

Referring to FIG. 7 showing a fourth embodiment, same structures as in the first embodiment are designated with the same reference numerals for simplicity. In the first embodiment, the processing of writing the monitor data into the external memory 9 is executed when the shut-off of the communication between the microcomputer 5 and the battery monitor IC 4 continues for the first threshold period T1. In the fourth embodiment, however, when the shut-off of the communication continues even after the execution of writing of the monitor data into the external memory 9, the processing of writing the monitor data into the external memory 9 is executed each time a predetermined period (third threshold period) T3 elapses after the writing of the monitor data into the external memory 9.

In the fourth embodiment, the third threshold period may be set to the same period as the first threshold period T1 or set to be longer or shorter than the first threshold period T1. The third threshold period T3 may be set variably to gradually become longer or gradually become shorter with time. Preferably a user is allowed to arbitrarily set the length of the third threshold period T3, set the length variably and the number of times of writings of the monitor data into the external memory 9.

Fifth Embodiment

Figure 8:
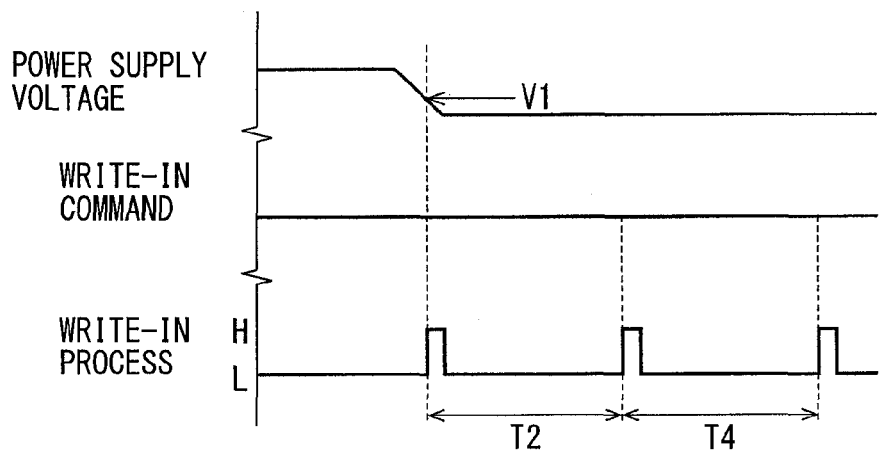
FIG. 8 is a time chart showing, in correspondence to FIG. 2D, an operation of a fifth embodiment of a battery monitor system.

Referring to FIG. 8 showing a fifth embodiment, same structures as in the first embodiment are designated with the same reference numerals for simplicity. In the first embodiment, the processing of writing the monitor data into the external memory 9 is executed when the power supply voltage of the IC power supply device 8 falls. In the fifth embodiment, however, when the shut-off of the power supply continues even after writing of the monitor data into the external memory 9, the processing of writing the monitor data into the external memory 9 is executed each time a predetermined period (fourth threshold period) T4 elapses after the execution of writing of the monitor data into the external memory 9.

In the fifth embodiment, the fourth threshold period T4 may be set to the same period as the second threshold period or set to be longer or shorter than the second threshold period T2. The fourth threshold period T4 may be set variably to gradually become longer or gradually become shorter with time. Preferably a user is allowed to arbitrarily set the length of the fourth threshold period T4, set the length variably and set the number of times of writings of the monitor data into the external memory 9.

Sixth Embodiment

Figure 9:
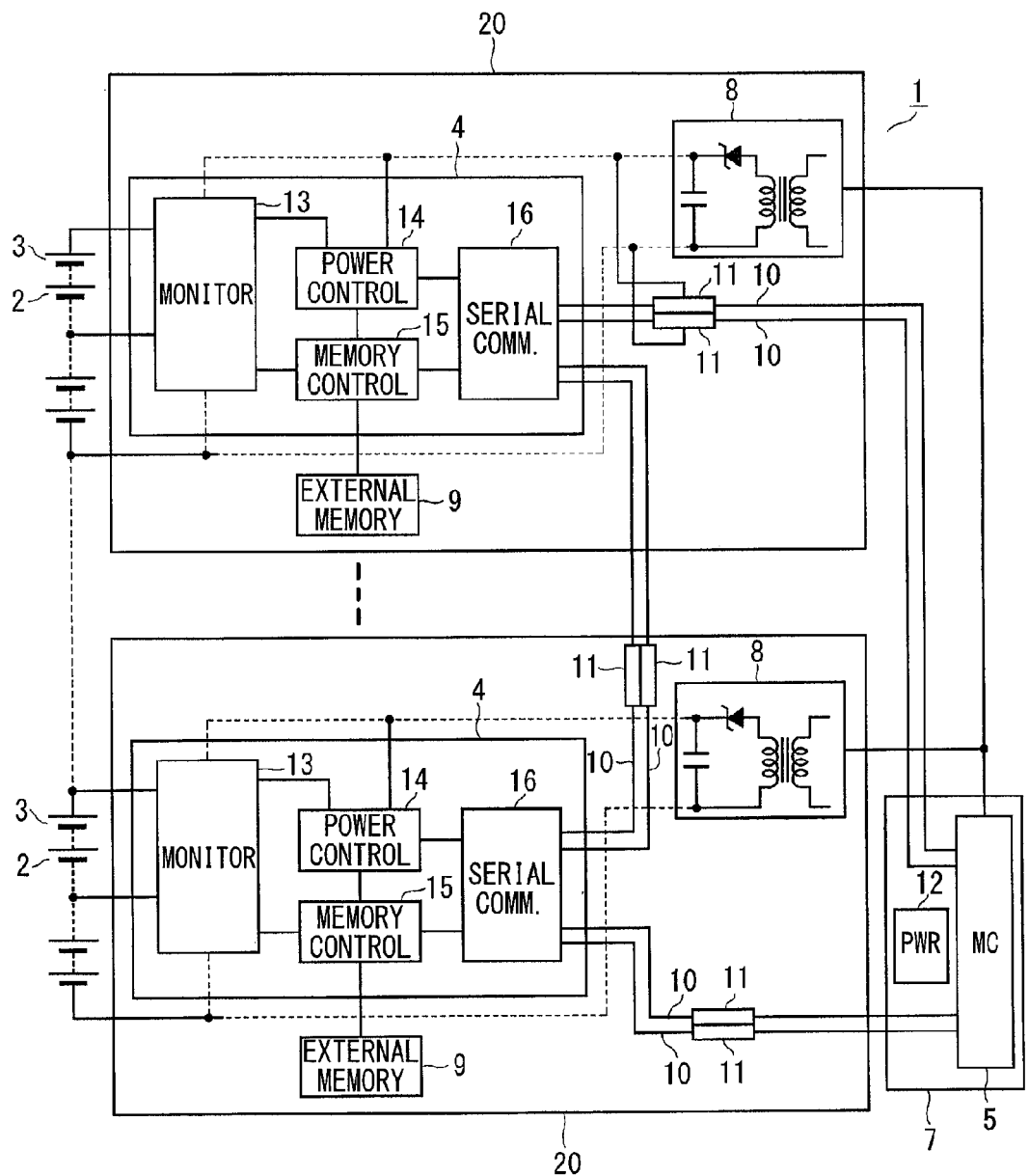
FIG. 9 is a block diagram showing, in correspondence to FIG. 1, a general configuration of a sixth embodiment of a battery monitor system.

Referring to FIG. 9 showing a sixth embodiment, same structures as in the first embodiment are designated with the same reference numerals for simplicity. According to the sixth embodiment, a battery monitor circuit board is divided into plural battery monitor circuit boards 20. On each circuit board 20, one battery monitor IC 4, one IC power supply device 8 and one external memory 9 are mounted for each battery group 3.

The sixth embodiment is configured similarly to the first embodiment except for the above-described divided circuit boards 20. As a result, the sixth embodiment also provides the similar operation and advantage as the first embodiment. According to the sixth embodiment, one battery monitor IC 4, one IC power supply device 8 and one external memory 9 are mounted on one of plural battery monitor circuit boards 20. As a result, even when one battery monitor IC 4 (or the IC power supply device 8 and the external memory 9) fails, only one battery monitor circuit board 20, on which the failing battery monitor IC 4 is mounted, need be replaced.

Seventh Embodiment

Figure 10:
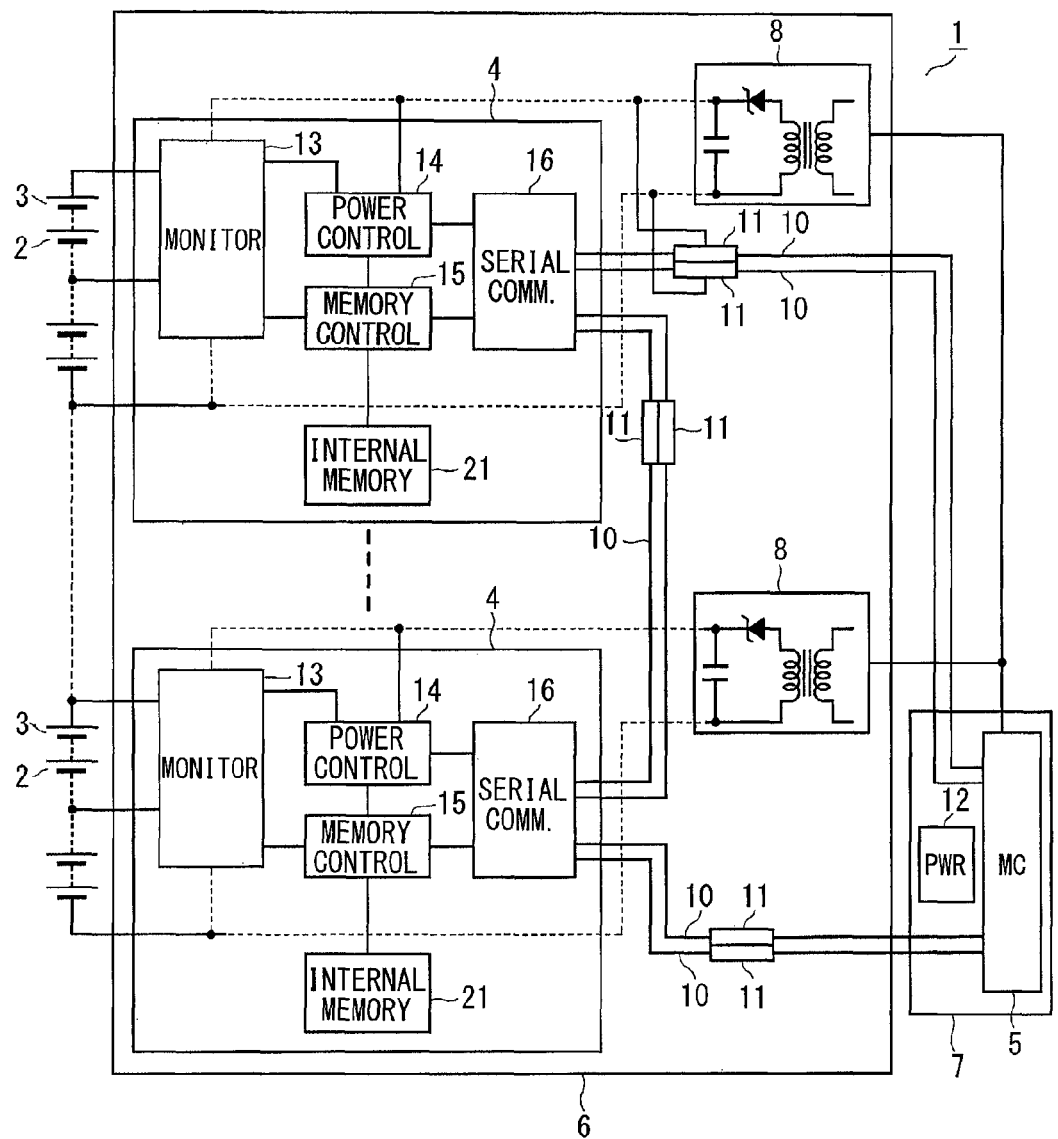
FIG. 10 is a block diagram showing, in correspondence to FIG. 1, a general configuration of a seventh embodiment of a battery monitor system.

Referring to FIG. 10 showing a seventh embodiment, same structures as in the first embodiment are designated with the same reference numerals for simplicity. According to the seventh embodiment, in place of the external memory 9, an internal memory 21 is built in the battery monitor IC4. The internal memory 21 is also a non-volatile memory such as an EEPOM. The seventh embodiment is configured similarly to the first embodiment except for the above-described internal memory 21. As a result, the seventh embodiment also provides the similar operation and advantage as the first embodiment.

Each of the first embodiment to the seventh embodiment may be combined one another to configure various embodiments. Each embodiment described above may be implemented in other different configuration with some removals, replacements or alterations.

What is claimed is:

1. A battery monitor system for plural battery groups, each of which is formed of plural battery cells, the battery monitor system comprising:
    plural monitor modules configured to monitor battery voltages of the plural battery groups, respectively, each of the monitor modules being provided with a serial communication circuit and a non-volatile memory for storing monitor data, which includes as hold data at least one of a voltage of a monitored battery and information of occurrence of abnormal processing;
    a monitor controller configured to communicate with the plural monitor modules, the monitor controller transmitting command signals to the plural monitor modules thereby to store the monitor data in the non-volatile memory; and
    plural communication lines connecting the plural monitor modules and the monitor controller in a ring shape through the serial communication circuit of each of the plural monitor modules,
    wherein each of the plural monitor modules includes a memory control circuit, which causes the non-volatile memory to store the monitor data in the non-volatile memory, when communication with the monitor controller is disabled for a predetermined threshold period.

2. The battery monitor system according to claim 1, wherein:
    the memory control circuit is configured to cause the non-volatile memory to store the monitor data repeatedly when the communication with the monitor controller continues to be disabled after the predetermined threshold period.

3. The battery monitor system according to claim 2, wherein:
    the battery monitor module includes a power supply switching circuit, which switches over a power supply system so that power is supplied from the battery group to the monitor module when a module power supply voltage supplied from a power supply circuit to the monitor module falls to be lower than a predetermined threshold voltage; and
    the memory control circuit is configured to cause the non-volatile memory to store the monitor data when the module power supply voltage of the power supply circuit falls to be lower than a predetermined threshold voltage.

4. The battery monitor system according to claim 3, wherein:
the memory control circuit is configured to cause the non-volatile memory to store the monitor data repeatedly when the module power supply voltage of the power supply circuit continues to be lower than the predetermined threshold voltage.

5. The battery monitor system according to claim 1, wherein:
the plural monitor modules are mounted on different circuit boards, respectively.

6. A battery monitor system for plural battery groups, each of which is formed of plural battery cells, the battery monitor system comprising:
plural battery groups, each of which is formed of plural battery cells;
plural monitor modules configured to monitor battery voltages of the plural battery groups, each of the monitor modules being provided with a serial communication circuit and a non-volatile memory for storing monitor data, which includes as hold data at least one of a voltage of a monitored battery and information of occurrence of abnormal processing;
a monitor controller configured to communicate with the plural monitor modules, the monitor controller transmitting command signals to the plural monitor modules thereby to store the monitor data in the non-volatile memory; and
plural communication lines connecting the plural monitor modules and the monitor controller in a ring shape through the serial communication circuit of each of the plural monitor modules, wherein
the battery monitor module includes a power supply switching circuit and a memory control circuit,
the power supply switching circuit is configured to switch over a power supply system so that power is supplied from the battery group to the monitor module when a module power supply voltage supplied from a power supply circuit to the monitor module falls to be lower than a predetermined threshold voltage, and
the memory control circuit is configured to cause the non-volatile memory to store the monitor data in the non-volatile memory when the module power supply voltage of the power supply circuit falls to be lower than the predetermined threshold voltage,
wherein:
the memory control circuit is configured to cause the non-volatile memory to store the monitor data repeatedly when the module power supply voltage of the power supply circuit continues to be lower than the predetermined threshold voltage,
the memory control circuit is configured to cause the non-volatile memory to store the monitor data in the non-volatile memory, when a predetermined threshold period elapses after the module power supply voltage of the power supply circuit falls to be lower than the predetermined threshold voltage; and
the memory control circuit is configured to cause the non-volatile memory to store the monitor data repeatedly at every another predetermined period different from the predetermined threshold period, when the module power supply voltage of the power supply circuit continues to be lower than the predetermined threshold voltage after the predetermined threshold period.

7. The battery monitor system according to claim 6, wherein:
the plural monitor modules are mounted on different circuit boards, respectively.

8. A battery monitor system for plural battery groups, each of which is formed of plural battery cells, the battery monitor system comprising:
plural battery groups, each of which is formed of plural battery cells;
plural monitor modules configured to monitor battery voltages of the plural battery groups, each of the monitor modules being provided with a serial communication circuit and a non-volatile memory for storing monitor data, which includes as hold data at least one of a voltage of a monitored battery and information of occurrence of abnormal processing;
a monitor controller configured to communicate with the plural monitor modules, the monitor controller transmitting command signals to the plural monitor modules thereby to store the monitor data in the non-volatile memory; and
plural communication lines connecting the plural monitor modules and the monitor controller in a ring shape through the serial communication circuit of each of the plural monitor modules, wherein
the battery monitor module includes a power supply switching circuit and a memory control circuit,
the power supply switching circuit is configured to switch over a power supply system so that power is supplied from the battery group to the monitor module when a module power supply voltage supplied from a power supply circuit to the monitor module falls to be lower than a predetermined threshold voltage, and
the memory control circuit is configured to cause the non-volatile memory to store the monitor data in the non-volatile memory when the module power supply voltage of the power supply circuit falls to be lower than the predetermined threshold voltage,
wherein:
the memory control circuit is configured to cause the non-volatile memory to store the monitor data in the non-volatile memory, when communication with the monitor controller is disabled for a predetermined threshold period; and
the memory control circuit is configured to cause the non-volatile memory to store the monitor data repeatedly at every another predetermined period different from the predetermined threshold period when the communication with the monitor controller continues to be disabled after the predetermined threshold period.

* * * * *